United States Patent [19]

Kaneko

[11] Patent Number: 4,999,484

[45] Date of Patent: Mar. 12, 1991

[54] MULTI-CHIP TYPE IMAGE SENSOR

[75] Inventor: Yutaka Kaneko, Yokohama, Japan

[73] Assignee: Ricoh Company, Ltd., Tokyo, Japan

[21] Appl. No.: 410,848

[22] Filed: Sep. 22, 1989

[30] Foreign Application Priority Data

Sep. 26, 1988 [JP] Japan ................. 63-240353

[51] Int. Cl.$^5$ ............................ H01J 40/14
[52] U.S. Cl. .................... 250/208.1; 358/30
[58] Field of Search ............. 250/208.1, 208.2, 578;
357/40, 75; 358/30 H, 30 G, 30 D, 30 L, 32

[56] References Cited

U.S. PATENT DOCUMENTS

| | | | |
|---|---|---|---|
| 4,418,284 | 11/1983 | Ogawa et al. | 250/208.1 |
| 4,467,342 | 8/1984 | Tower | 357/30 D |
| 4,523,102 | 6/1985 | Kazufumi et al. | 250/208.1 |

*Primary Examiner*—David C. Nelms
*Assistant Examiner*—Que T. Le
*Attorney, Agent, or Firm*—Oblon, Spivak, McClelland, Maier & Neustadt

[57] ABSTRACT

A multi-chip type image sensor includes, a base, a plurality of sensor chips arranged on the base so as to be staggered so that adjacent sensor chips among the sensor chips partially overlap with each other in the direction perpendicular to a direction in which the sensor chips are arranged. The sensor chips are fastened to the base by an adhesive for use in die bonding. Each of the sensor chips has a plurality of light receiving elements arranged into a line at a predetermined pixel pitch Pd. Each of the sensor chip contains silicon. Therminal pins are supported on the base and electrically coupled to the sensor chips. The following formula is satisfied:

$$Pc = Pd \times [1 + (Tc - Ta)(\alpha_B - \alpha Si)]$$

where Tc [°C.] is a curing temperature of the adhesive, Ta [°C.] is an environment temperature at which the image sensor is to be used, $\alpha_{Si}$ is a thermal expansion coefficient of each of the sensor chips comprising silicon, $\alpha_B$ is a thermal expansion coefficient of the base, and Pc is a pixel pitch at which the light receiving elements are arranged in each of the sensor chips before the adhesive is cured by die bonding.

4 Claims, 7 Drawing Sheets

MULTI-CHIP TYPE IMAGE SENSOR

BACKGROUND OF THE INVENTION

The present invention generally relates to a multi-chip type image sensor, and more particularly to a full-size contact type image sensor which includes a plurality of integrated circuit image sensor chips. Further, the present invention is concerned with a method of producing the multi-chip type image sensor.

Recently, in the field of image scanners, there has been considerable activity in the development of a full-size contact type image sensor in order to reduce the size of an optical system. There has been proposed an image sensor which employs an integrated circuit image sensor chip using a single silicon wafer. However, there is a limit in length of such an image sensor due to the size of the used silicon wafer. Therefore, an image sensor using a single silicon wafer is not suitable for constructing a full-size image sensor. In order to form a one-dimensional image sensor capable of reading a document of an ordinary size, it is required to arrange a plurality of integrated circuit image sensor chips on the same base. Such a sensor is called a multi-chip type image sensor. A conventional multi-chip type image sensor has been disclosed in "CCD CONTACT IMAGE SENSOR", ICS87-55.

In a conventional multi-chip type image sensor as proposed, a plurality of integrated circuit image sensor chips are arranged into a line. Alternatively, a plurality of chips are arranged so that adjacent chips partially overlap with each other. Each of the integrated circuit image sensor chips is formed of silicon and has a plurality of light receiving elements which are disposed at the same pitch (interval). Each of light receiving elements is photosensitive and generates an electric signal corresponding to light irradiated onto it. The integrated circuit image sensor chips are fastened on a single alumina base by die bonding, for example.

The following is known die bonding methods. Various parameters indicative of characteristics of the following die bonding methods are shown in respective tables.

TABLE 1

(Eutectic Bonding)

| | |
|---|---|
| Bonding material | Au—Si, Au—Ge or Au—Sn |
| Metallization for die back surface | Unnecessary or Au evaporation |
| Working temperature | 320–450° C. |
| Working atmosphere | Inactive atmosphere or reducing atmosphere |
| Ohmic property | Good |
| Heat dissipation | Good |
| Wire bonding adaptability | Yes |
| Furnace seal adaptability | Yes |
| Mass productivity | Good |
| Cost | High |

TABLE 2

(Solder Bonding)

| | |
|---|---|
| Bonding material | Pb-based solder or Sn-based solder |
| Metallization for die back surface | Ni, Ni—Au or Cr—Ni—Au etc. |
| Working temperature | 250–350° C. |
| Working atmosphere | Inactive atmosphere or reducing atmosphere |
| Ohmic property | Good |
| Heat dissipation | Good |

TABLE 2-continued (Solder Bonding)

| | |
|---|---|
| Wire bonding adaptability | No only for thermocompression bonding |
| Furnace seal adaptability | Yes |
| Mass productivity | Good |
| Cost | Medium |

TABLE 3

(Resin Bonding)

| | |
|---|---|
| Bonding material | Ag + epoxy, Ag + polyimide, or Ag + silicon |
| Metallization for die back surface | Unnecessary |
| Working temperature | Room temp. (curing occurs at 150–200° C.) |
| Working atmosphere | Air or inactive atmosphere |
| Ohmic property | Unstable |
| Heat dissipation | Poor |
| Wire bonding adaptability | Yes |
| Furnace seal adaptability | Yes only for polyimide system |
| Mass productivity | Excellent |
| Cost | Low |

TABLE 4

(Glass Bonding)

| | |
|---|---|
| Bonding material | PbO—B$_2$O$_3$-based glass |
| Metallization for die back surface | Unnecessary |
| Working temperature | 420–600° C. |
| Working atmosphere | Air |
| Ohmic property | Poor |
| Heat dissipation | Poor |
| Wire bonding adaptability | Yes |
| Furnace seal adaptability | Yes |

The above-indicated die bonding methods require high working temperatures. In the present state of the field, the resin bonding method is better than the other bonding methods in view of reliability, work efficiency and mass productivity.

In the resin bonding method, a heat curing type adhesive for die bonding is coated on a base to a thickness of about tens of microns with a width corresponding to that of sensor chip at room temperature by a dispense process, a stamp process or a screen printing process. Then, a plurality of sensor chips are located on the coated adhesive and pressed against the base. Thereafter, the sensor chips are subjected to a batch process by use of an oven in which the sensor chips are subjected to a heat curing process for one to two hours at a heating temperature between 120 and 250° C.

The following conductive adhesive agents for use in die bonding are available in a market. Various parameters indicative of properties of the following conductive adhesive agents are shown in respective tables.

TABLE 5

(Chemitight CT212 manufactured by Toshiba Chemical Corp)

| | |
|---|---|
| State (Compounding ratio) | one-liquid type |
| Solvent | available |
| Composition (filler/resin) | Ag/epoxy |
| Curing condition (temp./time) | 200° C./1 hr |
| Volume resistivity ($\Omega \cdot$ cm) | $0.6 \times 10^{-4}$ |
| Heat conductivity (cal/cm · sec. °C.) | $6 \times 10^{-3}$ |
| Extracted impurity (Cl$^-$ \| Na$^+$) | 5\|5 |

TABLE 6

| (EN-4000 manufactured by Hitachi Chemical Corp.) | |
| --- | --- |
| State (Compounding ratio) | one-liquid type |
| Solvent | available |
| Composition (filler/resin) | Ag/epoxy |
| Curing condition (temp./time) | 175° C./1 hr |
| Volume resistivity ($\Omega \cdot$ cm) | $2 \times 10^{-4}$ |
| Heat conductivity (cal/cm $\cdot$ sec. °C.) | $0.6 \times 10^{-3}$ |
| Extracted impurity ($Cl^-|Na^+$) | 10\|10 |

TABLE 7

| (EN-4070X-13 manufactured by Hitachi Chemical Corp.) | |
| --- | --- |
| State (Compounding ratio) | one-liquid type |
| Solvent | none |
| Composition (filler/resin) | Ag/epoxy |
| Curing condition (temp./time) | 150° C./1 hr to 250° C./40 sec |
| Volume resistivity ($\Omega \cdot$ cm) | $3.3 \times 10^{-4}$ |
| Heat conductivity (cal/cm $\cdot$ sec. °C.) | — |
| Extracted impurity ($Cl^-|Na^+$) | 10\|10 |

TABLE 8

| (CRM-1038 manufactured by Sumitomo Bakelite Corp.) | |
| --- | --- |
| State (Compounding ratio) | one-liquid type |
| Solvent | none |
| Composition (filler/resin) | Ag/epoxy |
| Curing condition (temp./time) | 200° C./1 hr ~ 170° C. /20 sec + 350° C. /20 sec |
| Volume resistivity ($\Omega \cdot$ cm) | $2 \times 10^{-4}$ |
| Heat conductivity (cal/cm $\cdot$ sec. °C.) | $3 \times 10^{-3}$ |
| Extracted impurity ($Cl^-|Na^+$) | 10\|10 |

TABLE 9

| (CRM-1058 manufactured by Sumitomo Bakelite Corp.) | |
| --- | --- |
| State (Compounding ratio) | one-liquid type |
| Solvent | available |
| Composition (filler/resin) | Ag/polyimide |
| Curing condition (temp./time) | 150° C./1 hr ~ 250° C./1 hr |
| Volume resistivity ($\Omega \cdot$ cm) | $2 \times 10^{-4}$ |
| Heat conductivity (cal/cm $\cdot$ sec. °C.) | — |
| Extracted impurity ($Cl^-|Na^+$) | 10\|20 |

TABLE 10

| (Ablebond 84-1 LMI manufactured by Ablestic Corp.) | |
| --- | --- |
| State (Compounding ratio) | one-liquid type |
| Solvent | none |
| Composition (filler/resin) | Ag/epoxy |
| Curing condition (temp./time) | 150° C./1 hr |
| volume resistivity ($\Omega \cdot$ cm) | $2 \times 10^{-4}$ |
| Heat conductivity (cal/cm $\cdot$ sec. °C.) | $4.5 \times 10^{-3}$ |
| Extracted impurity ($Cl^-|Na^+$) | 10\|10 |

TABLE 11

| (Ablebond 71-1 LMI manufactured by Ablestic Corp.) | |
| --- | --- |
| State (Compounding ratio) | one-liquid type |
| Solvent | available |
| Composition (filler/resin) | Ag/polyimide |
| Curing condition (temp./time) | 150° C./30 min ~ 275° C./30 min |
| volume resistivity ($\Omega \cdot$ cm) | $2 \times 10^{-4}$ |
| Heat conductivity (cal/cm $\cdot$ sec. °C.) | — |
| Extracted impurity ($Cl^-|Na^+$) | 10\|5 |

TABLE 12

| (EPO-TEK H-20ELC manufactured by Epoxy Technology Corp.) | |
| --- | --- |
| State (Compounding ratio) | two-liquid type (1:1) |
| Solvent | none |
| Composition (filler/resin) | Ag/epoxy |
| Curing condition (temp./time) | 120° C./15 min |
| volume resistivity ($\Omega \cdot$ cm) | $3 \times 10^{-4}$ |
| Heat conductivity (cal/cm $\cdot$ sec. °C.) | $4 \times 10^{-3}$ |
| Extracted impurity ($Cl^-|Na^+$) | 30\|— |

TABLE 13

| (EPO-TEK H35-175M manufactured by Epoxy Technology Corp.) | |
| --- | --- |
| State (Compounding ratio) | one-liquid type |
| Solvent | none |
| Composition (filler/resin) | Ag/epoxy |
| Curing condition (temp./time) | 180° C./1 hr |
| volume resistivity ($\Omega \cdot$ cm) | $2 \times 10^{-4}$ |
| Heat conductivity (cal/cm $\cdot$ sec. °C.) | — |
| Extracted impurity ($Cl^-|Na^+$) | 10\|10 |

TABLE 14

| (Du Pont 4621D manufactured by Du Pont) | |
| --- | --- |
| State (Compounding ratio) | one-liquid type |
| Solvent | available |
| Composition (filler/resin) | Ag/epoxy |
| Curing condition (temp./time) | 175° C./1 hr |
| volume resistivity ($\Omega \cdot$ cm) | $4 \times 10^{-4}$ |
| Heat conductivity (cal/cm $\cdot$ sec. °C.) | — |
| Extracted impurity ($Cl^-|Na^+$) | 20\|10 |

TABLE 15

| (C-990 manufactured by Amicon Corp.) | |
| --- | --- |
| State (Compounding ratio) | one-liquid type |
| Solvent | none |
| Composition (filler/resin) | Ag/epoxy |
| Curing condition (temp./time) | 155° C./1 hr |
| volume resistivity ($\Omega \cdot$ cm) | $6.5 \times 10^{-4}$ |
| Heat conductivity (cal/cm $\cdot$ sec. °C.) | — |
| Extracted impurity ($Cl^-|Na^+$) | 10\|5 |

TABLE 16

| (C-940 AXLC manufactured by Amicon Corp.) | |
| --- | --- |
| State (Compounding ratio) | one-liquid type |
| Solvent | available |
| Composition (filler/resin) | Ag/polyimide |
| Curing condition (temp./time) | 175° C./30 min ~ 275° C./30 min |
| volume resistivity ($\Omega \cdot$ cm) | — |
| Heat conductivity (cal/cm $\cdot$ sec. °C.) | — |
| Extracted impurity ($Cl^-|Na^+$) | 10\|20 |

In multi-chip type image sensors, integrated circuit image sensor chips must be held on the base so that the distance between adjacent light receiving elements provided in adjacent integrated circuit image sensor chips is identical to the distance between adjacent light receiving elements within the same sensor chip. Unless the distance satisfies the above-mentioned condition, the continuity of arrangement of light receiving elements is disturbed and therefore the reading quality is degraded.

As described in the aforementioned paper, the chip mounting methods by use of die bonding present a disadvantage that a positional deviation or error (misregistration) of sensor chips occurs during heat curing (die bonding). The positional deviation of sensor chips causes an error in the pixel pitch between neighboring light receiving elements of adjacent sensor chips (pixel pitch). The caused error deteriorates the reading quality.

The positional error of sensor chips caused during die bonding is further described. The thermal expansion coefficient of a sensor chip formed of silicon, $\alpha_{Si}$ is approximately $3.5 \times 10^{-6} [1/°C.]$, and the thermal expansion coefficient of a base formed of alumina $\alpha_B = \alpha(Al_2O_3)$ is nearly equal to $6.5 \times 10^{-6} [1/°C.]$. Curing temperatures of the aforementioned adhesives for use in die bonding are higher than 100° C. When sensor chips are fixed on a base by the heat curing process, the sensor chips and the base expand. However, it is noted that the degree of expansion for the silicon sensor chips is different from (less than) the degree of expansion of the alumina base. After heating the assembled of the sensor chips and the base to the curing temperature, temperature is decreased to room temperature. During this process, sensor chips contracts and therefore the size of sensor chips at room temperature becomes smaller than that of those before heat curing. As a result, the pixel distance between adjacent sensor chips becomes wider than that obtained before heat curing. In other words, the distance of adjacent elements within the same sensor chip becomes smaller than that obtained before heat curing. Particularly, sensor chips used for the full-size contact type image sensor are long and narrow. Therefore, the misregistration between each sensor chip and the base resulting from a difference in thermal expansion coefficient occurs greatly. For a full-size contact type color image sensor, a deviation of the tone of color occurs at joint portions of adjacent sensor chips. This causes a great deterioration in image quality.

The aforementioned paper teaches that a conventional image sensor has a misregistration equal to ±15 μm. Such a misregistration cannot satisfy specifications required for high-density image sensors, e.g., 400 dpi (dots per inch) for A3 size.

SUMMARY OF THE INVENTION

Accordingly, a general object of the present invention is to provide a multi-chip type image sensor in which the aforementioned disadvantages of conventional sensors are eliminated.

A more specific object of the present invention is to provide a multi-chip type image sensor having a desired pixel pitch regulated with high precision.

The above objects of the present invention can be achieved by a multi-chip type image sensor comprising a base, a plurality of sensor chips arranged on the base so as to be staggered so that adjacent sensor chips among the sensor chips partially overlap with each other in the direction perpendicular to a direction in which the sensor chips are arranged, the sensor chips being fastened to the base by an adhesive for use in die bonding, each of the sensor chips having a plurality of light receiving elements arranged into a line at a predetermined pixel pitch Pd, each of the sensor chip comprising silicon, and terminal pins supported on the base and electrically coupled to the sensor chips. The following formula is satisfied:

$$Pc = Pd \times [1 + (Tc - Ta)(\alpha_B - \alpha_{Si})]$$

where Tc [°C.] is a curing temperature of the adhesive, Ta [°C.] is an enviroment temperature at which the image sensor is to be used, $\alpha_{Si}$ is a thermal expansion coefficient of each of the sensor chips comprising silicon, $\alpha_B$ is a thermal expansion coefficient of the base, and Pc is a pixel pitch at which the light receiving elements are arranged in each of the sensor chips before the adhesive is cured by die bonding.

The aforementioned objects of the present invention can also be achieved by a multi-chip type image sensor comprising a base, a plurality of sensor chips arranged into a line on the base, the sensor chips being fastened to the base by a die bonding process in which a first adhesive is used, each of sensor chips comprising silicon and a plurality of light receiving elements arranged into a line at a predetermined pitch, a glass plate mounted on the sensor chips so as to cover the light receiving elements, the glass plate being fastened to the sensor chips by a second adhesive which hardens at a temperature lower than a curing temperature of the first adhesive, and terminal pins supported on the base and electrically coupled to the sensor chips. The following condition is satisfied:

$$|\alpha_3 - \alpha_1| < |\alpha_2 - \alpha_1|$$

where $\alpha_1$ is a thermal expansion coefficient of the base, $\alpha_2$ is a thermal expansion coefficient of each of the sensor chips, and $\alpha_3$ is a thermal expansion coefficient of the glass plate.

Another object of the present invention is to provide a method of producing the above-mentioned image sensor.

This object of the present invention can achieved by a method of producing a multi-chip image sensor including a plurality of sensor chips mounted on a base, each of the sensor chips having a plurality of light receiving elements, comprising the steps of joining the plurality of sensor chips together by a first adhesive, coating a second adhesive on the base, the first adhesive hardening at a temperature lower than a curing temperature of the second adhesive; positioning the joined sensor chips on the base through the second adhesive, and heating the second adhesive so that the image sensors are fastened to the base by the cured second adhesive.

Additional objects, features and advantages of the present invention will become apparent from the following detailed description when read in conjunction with the accompanying drawings.

DESCRIPTION OF THE PREFERRED EMBODIMENTS

A description is given of a multi-chip type image sensor according to a first preferred embodiment of the present invention with reference to FIGS. 1A, 1B, 2A, 2B and 2C.

A multi-chip type image sensor 1 is constructed as follows. A plurality of integrated circuit sensor chips (five sensor chips $3a$, $3b$, $3c$, $3d$ and $3e$ for the illustrated example) are mounted on a reading line defined on a long and narrow base 2 in such a manner that adjacent sensor chips such as chips $3a$ and $3b$ overlap slightly in the direction perpendicular to the reading line. In other words, the sensor chips $3a$–$3e$ are staggered. Each of the sensor chips $3a$–$3e$ includes charge coupled devices (CCDs). Read effective lengths l of the sensor chips $3a$–$3e$ are mutually identical. A read effective length of the image sensor L is equal to the sum of the read effective lengths l of the sensor chips $3a$–$3e$, that is, 5 l. The read effective length L is set equal to 304.8 mm, for example. A transparent cover glass 4 is mounted on the base 2 so as to cover the arrangement of the sensor chips $3a$–$3e$. A plurality of pins 5 coupled to the related sensor chips $3a$–$3e$ which extend elevationally are arranged along a long end of the base 2. The sensor chips $3a$–$3e$ are electrically coupled to a printed circuit formed on the base 2 in the same manner as conventional image sensors.

Figure 2A:
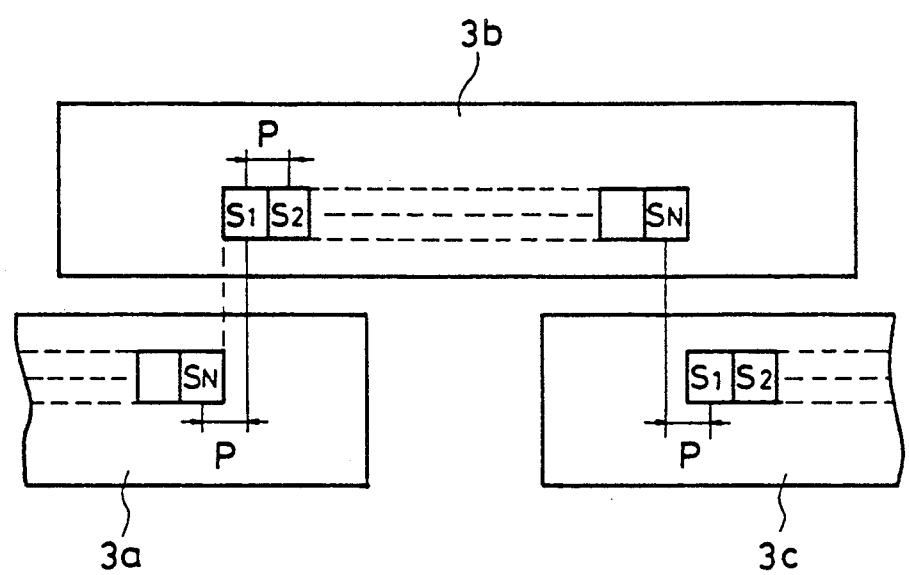
FIG. 2A is a plan view illustrating how to join adjacent sensor chips together.
Figure 2B:
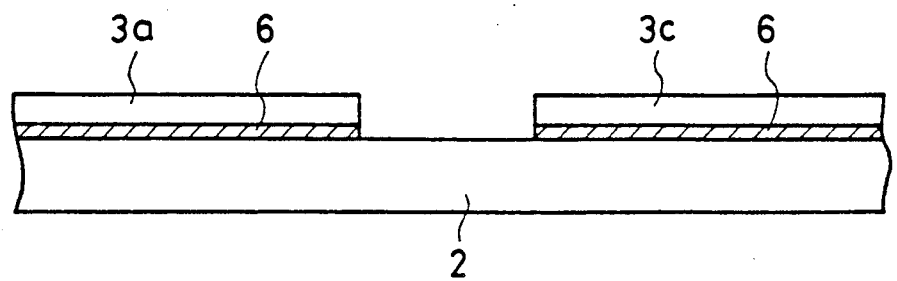
FIG. 2B is a cross sectional view illustrating how to join adjacent sensor chips together.

Each of the sensor chips $3a$–$3e$ is formed as shown in FIGS. 2A and 2B. Each of the sensor chips $3a$–$3e$ is made up of N (N is an integer) light receiving elements $S_1, S_2, \ldots, S_N$ which are arranged into a line at a predetermined pitch P measured in the longitudinal direction. The adjacent sensor chips $3a$ and $3b$ are located so that the last light receiving element $S_N$ of the sensor chip $3a$ and the first light receiving element $S_1$ of the sensor chip $3b$ are arranged at the pitch P. The last light receiving element $S_N$ of the sensor chip $3b$ and the first light receiving element $S_1$ of the sensor chip $3c$ are arranged at the pitch P. The other sensor chips are located in the same manner. The sensor chips $3a$–$3e$ are fastened on the base 2 by use of an adhesive 6 for use in die bonding, as shown in FIG. 2B.

The base 2 is formed of alumina, and each of the sensor chips $3a$–$3e$ is formed of silicon. Parameters indicative of properties of alumina are shown below.
Major component: $Al_2O_3$ 92–94%, $SiO_2$, MgO, etc.
Resistance: $10^{12}$ [Ω·cm]
Thermal expansion coefficient (0°–100° C.): $6.0$–$6.5 \times 10^{-6}$ [°C$^{-1}$]
Thermal conductivity: 0.03–0.04 [cal/cm·s·°C.]
Permittivity (1 MHz): 8.5–9.5
Dielectric dissipation factor (1 MHz): 0.001
Heat-resistant temperature: 1000 [°C.] or higher
Modulus of longitudinal elasticity: $3.7$–$4.1 \times 10^4$ [kg/mm$^2$]
Bending strength (tensile strength): 30–35 [kg/mm$^2$]
α-ray occurrence ratio: 0.03–0.5 [number/time·cm$^2$]

Parameters indicative of properties of silicon are shown below.
Major component: Si
Resistance: $2.3 \times 10^4$ [Ω·cm]
Thermal expansion coefficient (0°–100° C.): $3.5 \times 10^{-6}$ [°C.$^{-1}$]
Thermal conductivity: 0.2–0.35 [cal/cm·s·°C.]
Permittivity (1 MHz): 12
Dielectric dissipation factor (1 MHz): None
Heat-resistant temperature: 1414 [°C.]
Modulus of longitudinal elasticity: $C_1 1.7$, $C_{12} 0.7$, $C_{14} 0.8$ [kg/mm$^2$]
Bending strength (tensile strength): 30 [kg/mm$^2$]/10 min
α-ray occurrence ratio: 0.01 [number/time·cm$^2$]

For example, the aforementioned EPO-TEK H-20ELC (manufactured by Epoxy Technology Corp.) is used as the adhesive 6 for use in die bonding. The curing temperature Tc is set equal to 120° C. The enviroment temperature Ta to be set during chip production (particularly, exposure for mask alignment) and use of the image sensor 1 is equal to 20° C.

Under the above-mentioned condition, a difference in expansion (difference in size) obtained at the curing temperature Tc is written as follows:

$$\begin{aligned} \delta l &= \Delta l(Al_2O_3) - \Delta l_{Si} \\ &= (\alpha(Al_2O_3) - \alpha_{Si})(Tc - Ta) \cdot l \end{aligned}$$

where $l(Al_2O_3)$ is the length of the alumina base 2, $l_{Si}$ is the length of each of silicon sensor chips $3a$–$3e$ (chip effective length), $\alpha(Al_2O_3)$ is the thermal expansion coefficient of the alumina base 2, and $\alpha_{Si}$ is the thermal expansion coefficient of each of the silicon sensor chips $3a$–$3e$. Hereinafter, the silicon sensor chips $3a$–$3e$ are also referred to as silicon sensor chips 3 for convenience' sake. In the state defined by the above formula, the sensor chips 3 are fastened on the base 2. On the other hand, the alumina base 2 and the silicon sensor chips 3 are contracted as the temperature thereof decreases from the curing temperature Tc to room temperature Ta at which the image sensor 1 is used. It is noted that the thermal expansion coefficient for alumina is larger than that for silicon and therefore the alumina base 2 is contracted more greatly than the silicon sensor chips 3. During contraction, a strain ε is caused to equilibrate force P exerted on the alumina base 2 and the sensor chips 3 so that the sensor chips 3 are stabilized on the alumina chip 2. The strain ε is written as follows:

$$\epsilon = \sigma/E$$

$$\sigma = P/A$$

where σ is a stress, E is the modulus of longitudinal elasticity, and A is a cross section. Consequently, the equilibrium condition is described as follows:

$$\begin{aligned} P &= A(Al_2O_3) \cdot \epsilon(Al_2O_3) \cdot E(Al_2O_3) \\ &= A_{Si} \cdot \epsilon_{Si} \cdot E_{Si} \end{aligned}$$

and the following is obtained:

$$\epsilon(Al_2O_3)/\epsilon_{Si} = (A_{Si} E_{Si})/[A(Al_2O_3) \cdot E(Al_2O_3)] << 1$$

For example, $A_{Si} = 0.7$ mm wide $\times 0.5$ mm thick $= 0.35$ mm$^2$, $A(Al_2O_3) = 20$ mm wide $\times 1.6$ mm thick $= 32$ mm$^2$, $E_{Si} \approx 1.7 \times 10^4$ kg/mm$^2$, and $E(Al_2O_3) \approx 3.8 \times 10^4$ kg/mm$^2$. As a result, and stress $\sigma$ is less dependent on the strain $\epsilon$. That is, the alumina base 2 is contracted according to its thermal expansion coefficient $\alpha(Al_2O_3)$, and the sensor chip 3 is compressed where a strain corresponding to the difference in thermal expansion coefficient between the alumina base 2 and each sensor chip 3, that is, $\alpha(Al_2O_3) - \alpha_{Si}$ is caused. For example, when $l = 61$ mm, and $(Tc - Ta) = 95°$ C., an amount of strain caused in each sensor chip 3 is described as follows:

$$\begin{aligned}\delta\sigma &= l(Tc - Ta)(\alpha(Al_2O_3) - \alpha_{Si}) \\ &= 61 \times (120 - 20)(6.5 \times 10^{-6} - 3.5 \times 10^{-6}) \\ &= 18.3 \ \mu m.\end{aligned}$$

The above value corresponds to the misregistration of pixel arrangement caused at joint portions of adjacent sensor chips.

On the other hand, the present embodiment is made by paying attention to the fact that each of the sensor chips 3 is adhesive-fastened to the base 2 by the heat curing (heat hardening) process and by taking into consideration thermal expansion and contraction due to heat curing. That is, according to the embodiment, a pixel pitch Pc before heat curing is set larger than the predetermined pixel pitch Pd so that the compression strain caused in each sensor chip 3 when temperature thereof returns to room (enviroment) temperature Ta from the curing temperature Tc, is compensated beforehand. In detail, each of the sensor chips 3 is produced so that the pixel pitch Pc is selected according to the following formula:

$$Pc = Pd \times [1 + (Tc - Ta)(\alpha(Al_2O_3) - \alpha_{Si})]$$

where Tc [°C.] is the curing temperature of the adhesive 6 for heat curing die bonding, Ta [°C.] is room temperature set equal to enviroment temperature of the image sensor 1 when it is used, $\alpha_{Si}$ is the thermal expansion coefficient of the sensor chips 3 formed of silicon, and $\alpha(Al_2O_3)$ is the thermal expansion coefficient of the base 2 formed of alumina.

The above-identified formula can be written into a general form as follows:

$$Pc = Pd \times [1 + (Tc - Ta)(\alpha_B - \alpha_{Si})]$$

where $\alpha_B$ is the thermal expansion coefficient of a material forming the base 2.

It is particularly effective to producing the sensor chips 3 so that $\sigma \geq Pd/4$ is satisfied because the CCITT defines that reading error should be within $\pm 25\%$ of the regular pitch Pd. This requirement is also important in view of image reading quality. For a color sensor chip where a color filter is provided in the direction of arrangement of the sensor chips 3, $\sigma \geq Pd/12$ should be satisfied in order to reduce a change in the tone of color.

The aforementioned embodiment relates to the image sensor which uses the conductive adhesive 6 for use in die bonding by resin bonding. The present invention includes an image sensor which uses a nonconductive adhesive for die bonding, or die bonding processes other than resin bonding. In eutectic bonding, solder bonding or glass bonding, soldifying temperature of an adhesive used is equal to the curing temperature for resin bonding.

Figure 1A:
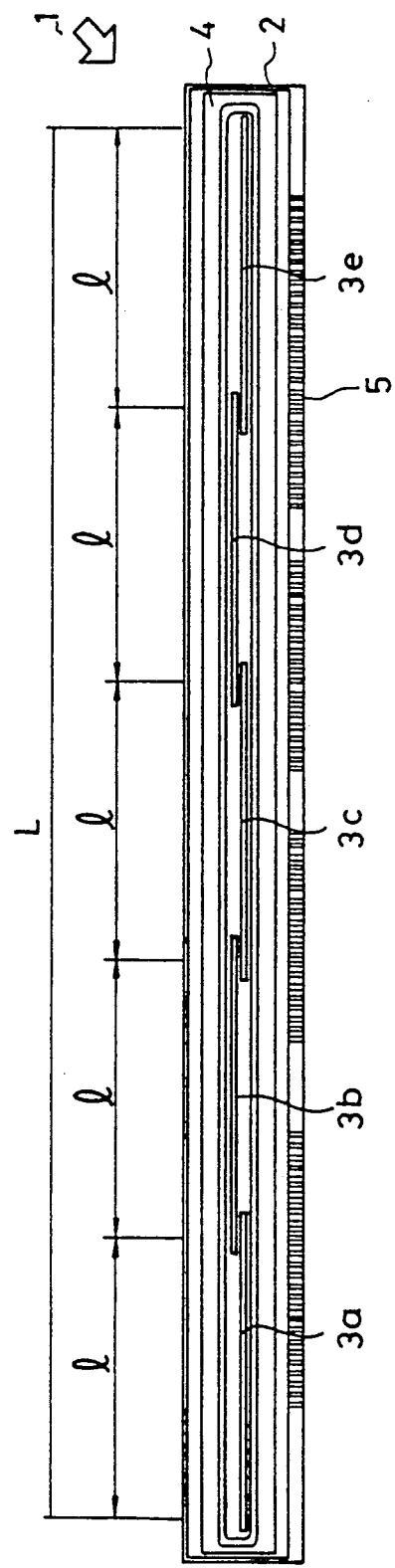
FIG. 1A is a plan view of a first embodiment of the present invention.
Figure 1B:
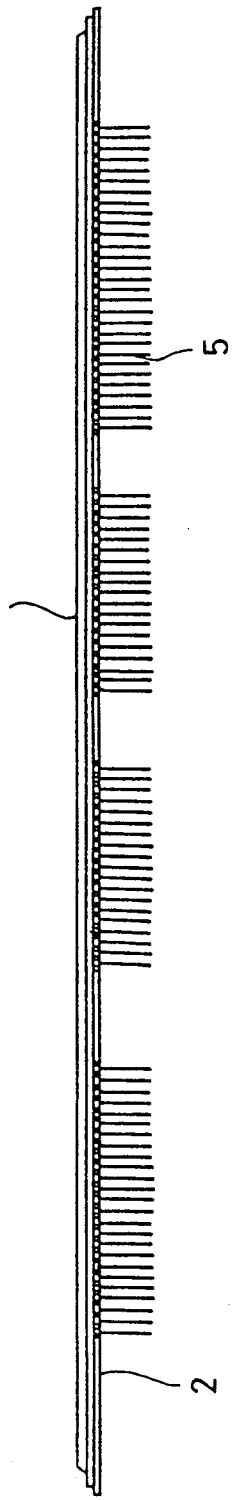
FIG. 1B is a front view of the first embodiment.
Figure 1C:
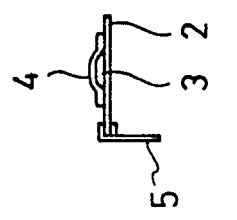
FIG. 1C is a side view of the first embodiment.
Figure 3:
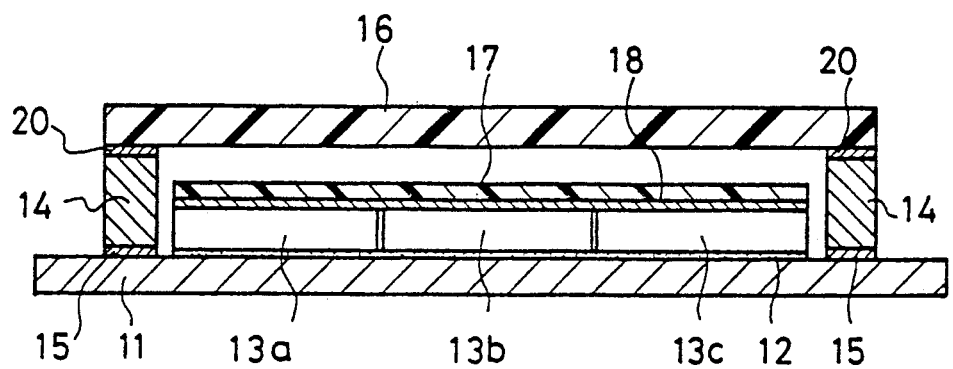
FIG. 3 is a cross sectional view of a second embodiment of the present invention.
Figure 4:
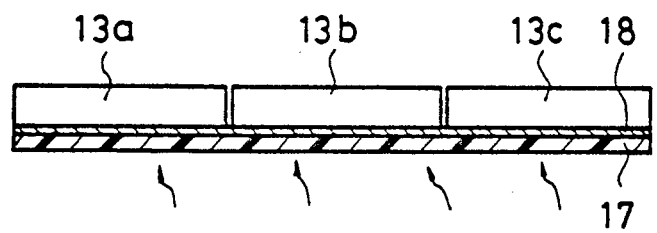
FIGS. 4 and 5 are views illustrating steps of constructing the image sensor of the second embodiment.
Figure 5:
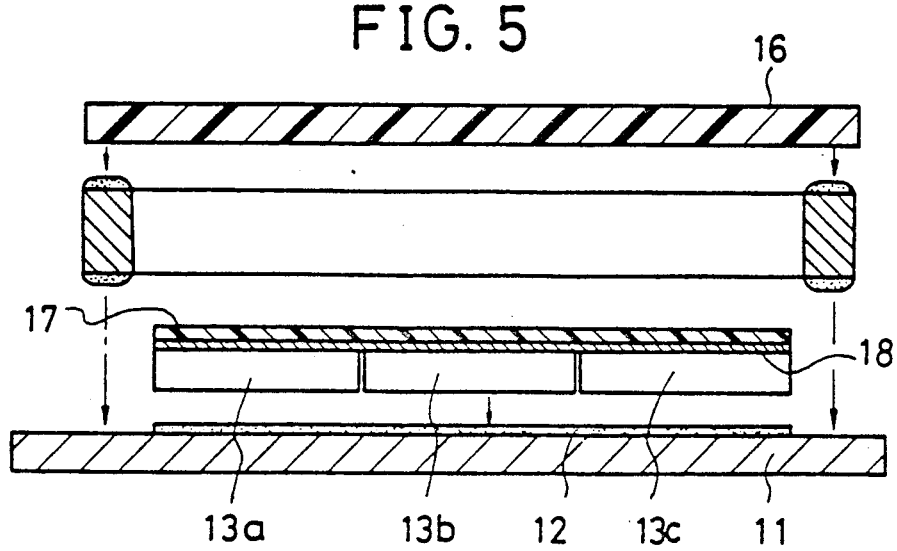

A description is given of a second preferred embodiment of the present invention with reference to FIGS. 3 to 5. Referring to these figures, a plurality of integrated circuit image sensor chips 13a, 13b and 13c each including a plurality of CCDs are arranged into a line and fixed on a base 11 through an adhesive 12 for use in die bonding. The sensor chips 13a and 13b are separated from each other at a predetermined interval, and the sensor chips 13b and 13c are separated from each other at the same interval. The sensor chips 13a, 13b and 13c are electrically coupled to a printed circuit (not shown) formed on the base 11. Each of the sensor chips 13a, 13b and 13c is formed of silicon, and the base 11 is formed of alumina, for example. As shown in FIG. 3, a stationary transparent glass plate 17 which is narrower and long as the base 11 is mounted on and fastened to the sensor chips 13a, 13b and 13c through a transparent adhesive 18 of a room temperature hardening type or an ultraviolet hardening adhesive. Therminal pins such as the terminal pins 5 shown in FIG. 1C are omitted for the sake of simplicity.

In an assembling process, as shown in FIG. 4, the sensor chips 13a, 13b and 13c are arranged into a line on the glass plate 17, and fastened thereto by irradiating ultraviolet rays onto the adhesive 18 at room temperature. The surface of the glass plate 17 on which the sensor chips 13a, 13b and 13c are mounted is opposite to the surface thereof which faces the base 11. Then, as shown in FIG. 5, spacers 14 are fastened on the base 11 through an adhesive 15 of a room temperature hardening type. The spacers 14 are formed so as to completely or partially surround the sensor chips 13a, 13b and 13b. In the illustrated structure, the spacers 14 are provided on both the sides of the arrangement of the sensor chips 13a, 13b and 13c in the longitudinal direction. Thereafter, the adhesive 12 is coated on the base 11. Then, as shown in FIG. 3, the assembly shown in FIG. 4 is positioned on the adhesive 12 so that the bottom surface of each of the sensor chips 13a, 13b and 13c faces the base 11. Then the assembly shown in FIG. 5 is subjected to the heat curing process so that the sensor chips 13a, 13b and 13c are adhesive-fastened to the base 11. Finally, a transparent sealing glass 16 is mounted on the spacers 14 and fastened thereto through an adhesive layer 20 of a room temperature hardening type.

The glass plate 17 is formed by a $Na_2O\text{-}CaO\text{-}SiO_2$-based glass plate. The thermal expansion coefficient $\alpha_{SH}$ and the modulus of longitudinal elasticity of the $Na_2O\text{-}CaO\text{-}SiO_2$-based glass plate 17 $E_{SH}$ are as follows:

$$\alpha_{SH} \approx 8.5 \times 10^{-6} \ [°C.]$$

$$E_{SH} \approx 0.7 \times 10^4 \ [kg/mm^2]$$

For these values, an amount of expansion of the $Na_2O\text{-}CaO\text{-}SiO_2$-based glass plate 17 caused during heat curing is obtained as follows:

$$\epsilon_{SH}/\epsilon_{Si} << 1$$

where it is assumed that other parameters are the same as those described previously. Therefore, the following formula is obtained:

$$\Delta l_{SH} \approx l(T_c - T_a) a_{SH}$$
$$= 61 \times (120 - 20) \times 8.5 \times 10^{-6}$$
$$= 52 \mu m.$$

An amount of expansion of the alumina base 11 obtained at this time is 40 μm as described previously. It follows that the difference in expansion between the glass plate 17 and the base 11 is fixed to 8 μm. As a result, the following relationship is obtained:

$$\epsilon_{SH}/\epsilon(Al_2O_3) > 1$$

It can be seen that the positional error of adjacent sensor chips caused during the step in which temperature thereof decreases to room temperature from the curing temperature is equal to or less than 12 μm. This is considerably less than that for the conventional image sensor.

It can be seen from the above description that the glass plate 17 should be formed of a material which satisfies the following condition:

$$|a_G - a_B| < |a_{Si} - a_B|$$

where $a_G$ is the thermal expansion coefficient of a material forming the glass plate 17.

Figure 6:
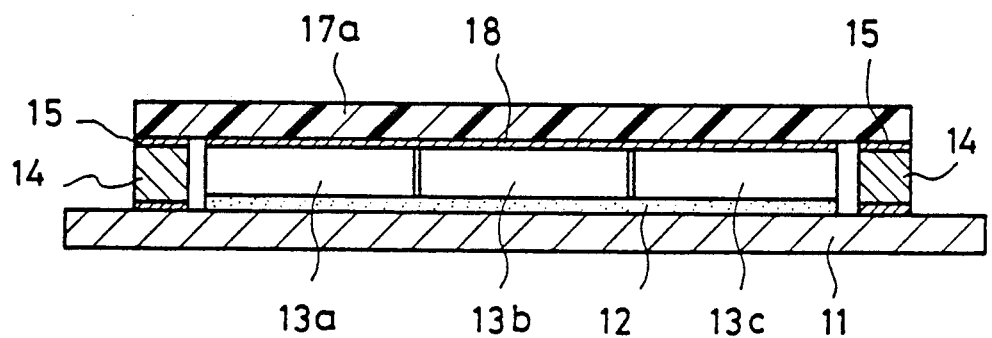
FIG. 6 is a cross sectional view of a variation of the second embodiment shown in FIGS. 3 through 5.

A description is given of a variation of the second embodiment with reference to FIG. 6. An essential feature of the variation is that a glass plate 17a functions to not only fix the sensor chips 13a, 13b and 13c but also seal them. In other words, the glass plate 17a shown in FIG. 6 serves as both the glass plate 17 and the sealing glass 16 shown in FIG. 5. The glass plate 17a is mounted on and fastened to the spacer 14 through the adhesive 15.

The variation shown in FIG. 6 presents the following specific advantages, as compared with the second embodiment shown in FIGS. 3 through 5. First, the image sensor of the variation can be formed by a smaller number of structural parts than the image sensor of the second embodiment. Second, loss of light for the variation is less than that for the second embodiment.

The aforementioned second embodiment and its variation relate to the image sensors which use the conductive adhesive 18 for use in die bonding by resin bonding. The present invention includes an image sensor which uses a nonconductive adhesive for die bonding or die bonding processes other than resin bonding. In eutectic bonding, solder bonding or glass bonding, soldifying temperature of an adhesive used is equal to curing temperature for resin bonding.

Figure 7:
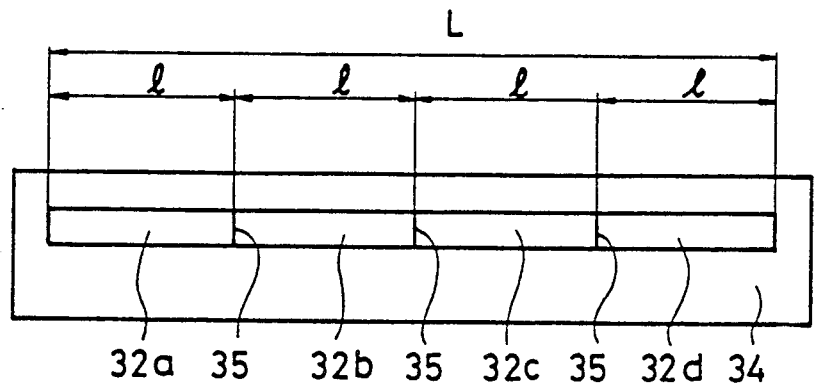
FIG. 7 is a plan view of a third embodiment of the present invention.
Figure 8A:
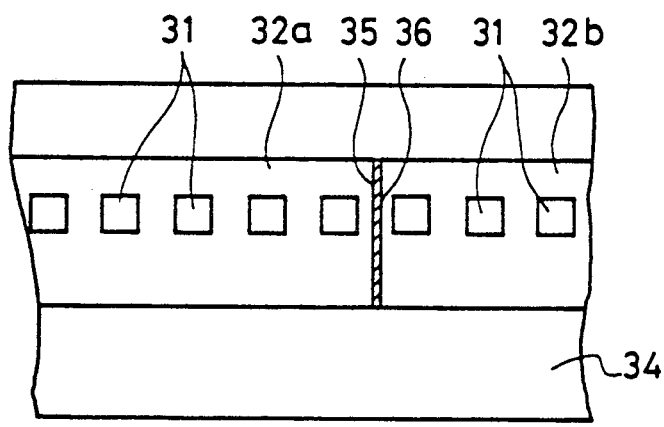
FIGS. 8A and 8B are plan and cross sectional views of the third embodiment, respectively.
Figure 8B:
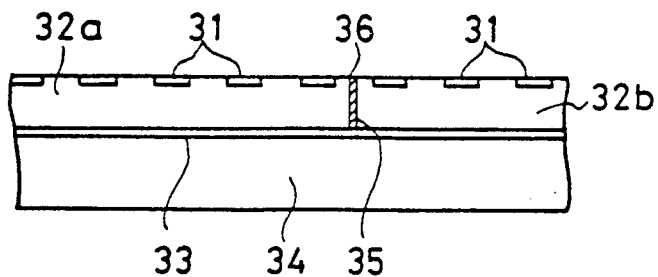

A description is given of a third preferred embodiment of the present invention with reference to FIGS. 7, 8A and 8B. FIG. 7 illustrates the entire structure of an image sensor according to the third embodiment. The illustrated image sensor includes a plurality of integrated circuit image sensor chips 32a, 32b, 32c and 32d arranged into a line on a base 34. The illustrated arrangement itself is conventional. An essential feature of the third embodiment exists in a process of constructing the image sensor. The sensor chips 32a-33d are adhesive-joined together so as to be arranged in a line in such a manner that each joint portion between each set of two adjacent sensor chips among the sensor chips 32a-32d is provided with an adhesive 36 which is hardened at temperatures lower than a temperature at which an adhesive 33 for use in a heat curing type die bonding is cured. Then, the joined sensor chips 32a-32d are mounted on the base 34 through the adhesive 33 and fixed thereto by the curing process.

A low-temperature hardening type adhesive or an ultraviolet hardening type adhesive may be used as the adhesive 36. For example, type "390" of the heat-resistant adhesive 300 series (hardening condition: 30 minutes at room temperature) manufactured by Epoxy Technology Corp. or heat-resistant adhesive series 301 (adhesive for optical use) (hardening condition: one hour at 65° C.) manufactured by the same company is a low-temperature hardening type adhesive. NOR60 manufactured by Norland Products Corp is an ultraviolet hardening type adhesive. The adhesive 33 may be one of the aforementioned heat curing type adhesive agents for die bonding shown in Tables 5 through 16.

The occurrence of positional errors (misregistration) of the adjacent sensor chips can be suppressed since the joint portions 35 are adhesive connected through the adhesive 36 at low temperatures. The joined sensor chips 32a-32d having less positional errors are fixed on the base 33 by use of the heat curing adhesive 33 for use in die bonding. Thus, it becomes possible to suppress the occurrence of misregistration between the sensor chips 32a-32d and the base 33 resulting from a difference in thermal expansion coefficient therebetween. Hence, it is possible to precisely define the pitch between adjacent light receiving elements in adjacent sensor chips so that it is almost the same as chip alignment precision (5 μm or less, for example). Thus, it is possible to prevent degradation of reading quality of light receiving elements which are located in the vicinity of the joint portions 35. As a result, the third embodiment can provide a multi-chip image sensor having a high density of 400 dpi.

Figure 9A:
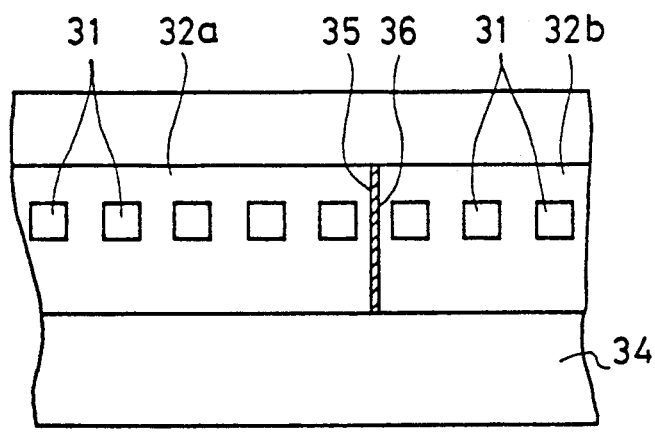
FIGS. 9A and 9B are plan and cross sectional views of a fourth embodiment of the present invention, respectively.
Figure 9B:
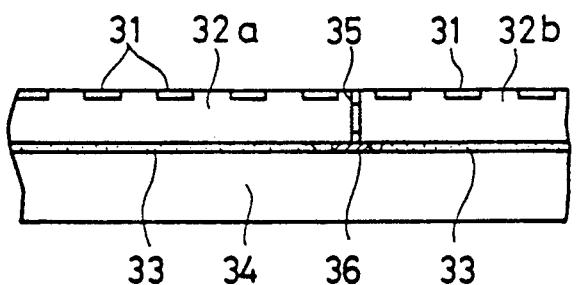

A description is given of a fourth preferred embodiment of the present invention with reference to FIGS. 9A and 9B, in which those parts which are the same as those or the same properties as those shown in FIGS. 7, 8A and 8B are given the same reference numerals. The adhesive 33 for use in heat curing type die bonding is coated on the surface of the base 34 except an area corresponding to the joint portion 35. Next, the adhesive 36 is dispensed on the area corresponding to the joint portion 35. Then the sensor chips 32a-32d are aligned on the adhesive 33 and the adhesive 36 so that the joint portion 35 is located on the layer of the adhesive 36. Then, the adhesive 36 is hardened so that the sensor chips 32a-32d are adhesive-joined together on the base 34. Thereafter, the adhesive 33 for use in heat curing type die bonding is cured, so that the sensor chips 32a-32d can rigidly be fixed to the base 34.

Figure 10A:
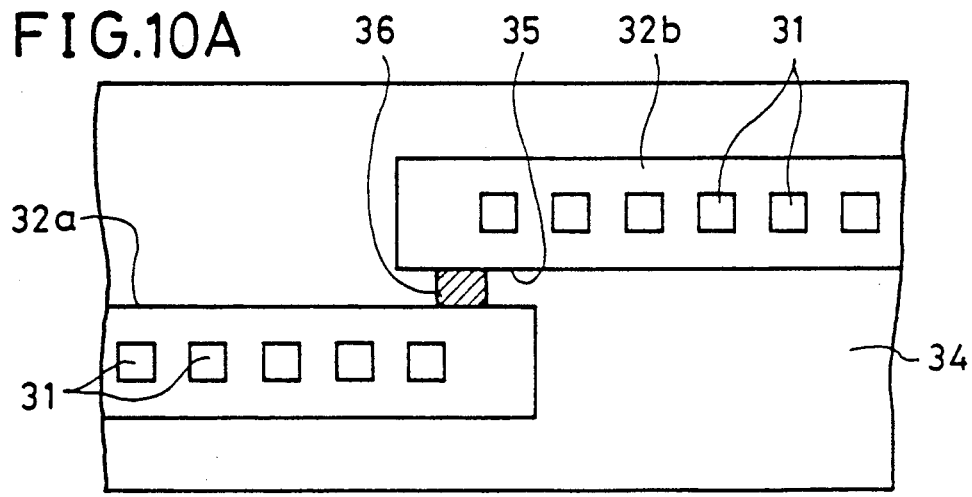
FIGS. 10A and 10B are plan and cross sectional views of a fifth embodiment of the present invention, respectively.
Figure 10B:
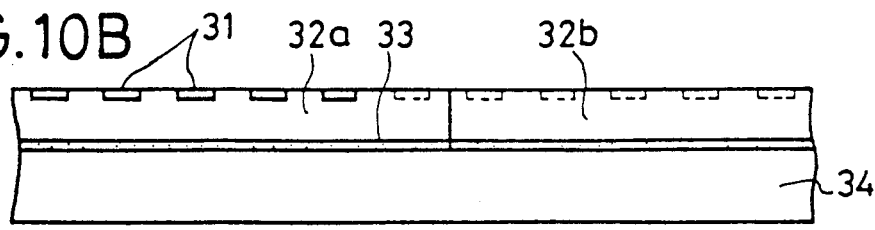

A description is given of a fifth preferred embodiment of the present invention with reference to FIGS. 10A and 10B. The production method according to the fifth embodiment can be applied when constructing the image sensor of the first embodiment. First, the sensor chips 32a and 32b are located so as to be staggered and joined together by the adhesive 36. Of course, the other sensor chips are processed at the same time. Then the staggered sensor chips 32a-32d are mounted on the base 34 through the adhesive 33 and is then cured.

A description is given of a sixth preferred embodiment of the present invention with reference to FIGS.

Figure 11A:
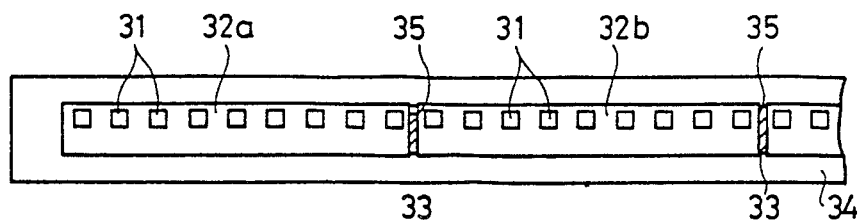
FIGS. 11A and 11B are plan and cross sectional views of a sixth embodiment of the present invention, respectively.
Figure 11B:
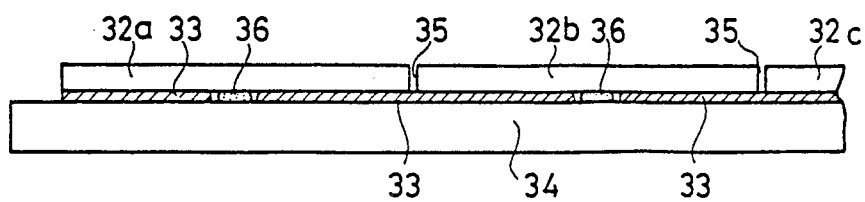
Figure 11C:
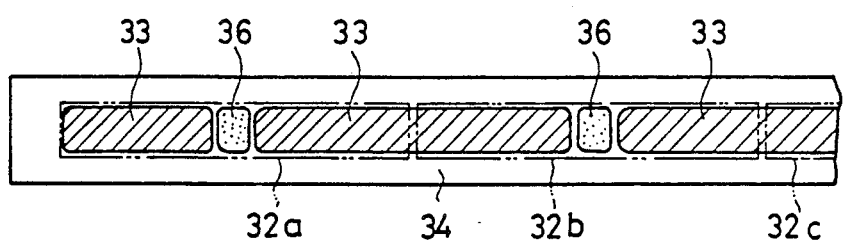
FIG. 11C is a diagram illustrating adhesive areas for the sixth embodiment.

11A through 11C. An essential feature of the sixth embodiment is that the aforementioned adhesive 36 is provided in an intermediate surface area of the base 34 interposed between the joint portions 35. For the embodiment shown in FIGS. 11A through 11B, each of the adhesive layers 36 is located in an area corresponding to the center of the corresponding sensor chip when mounted on the base 34. As described previously, the low-temperature hardening type adhesive 36 hardens at a temperature lower than the adhesive 33 for use in heat curing type die bonding. The adhesive 33 is also coated in surface areas of the base 34 in which the sensor chips 32a–32d are to be positioned. Then, the sensor chips 32a–32d are positioned on the adhesive layers 33 and 36 and pressed against the base 34 at room temperature. Thereby, the sensor chips 32a–32d are provisionally fixed to the base 34 and positioned thereon. Thereafter, the heat curing type adhesive 33 for use in die bonding is cured by heating so that the sensor chips 32a–32d can tightly be adhesive-fixed to the base 34. The provisional fixing of the sensor chips 32a–32d by use of the adhesive layer 36 functions to prevent the occurrence of misregistration of the sensor chips 32a–32d arising from the difference in thermal expansion coefficient between the sensor chips 32a–32d and the base 34. Thus, it is possible to precisely define the pitch between adjacent light receiving elements in adjacent sensor chips so that it is almost the same as chip alignment precision (5 $\mu$m or less, for example).

The adhesive 36 of a low-temperature hardening type may be one of the adhesives described previously. Alternatively, "ECOBOND" manufactured by Grace Japan may be used as the adhesive 6.

Figure 12A:
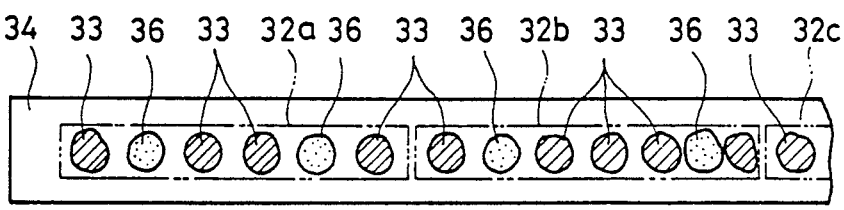
FIGS. 12A and 12B are diagrams illustrating adhesive areas for a seventh embodiment of the present invention.
Figure 12B:
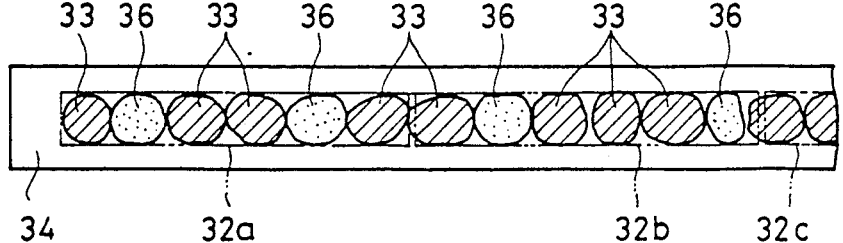

A description is given of a seventh embodiment of the present invention with reference to FIGS. 12A and 12B. An essential feature of the seventh embodiment is that at least two adhesive points by use of the low-temperature hardening type adhesive 36 are provided for each of the chips 32a–32d so that they are not adjacent to each other. As shown in FIG. 12A, the adhesive spots 33 and the adhesive spots 36 are coated on the base 34 by the dispense process. Then, the sensor chips 32a–32d are positioned and pressed against the base 34. Thereby, as shown in FIG. 12B, the adhesive spots 33 and 36 spread on the entire interface between the base 34 and each of the sensor chips 32a–32d. The sensor chips 32a–32d are provisionally fixed on the base 34 by the adhesive 36 at room temperature. Then the adhesive 33 is cured whereby the sensor chips 32a–32d are completely adhesive-fastened to the base 34. The seventh embodiment is particularly advantageous to an image senor which includes very long sensor chips (0.7 mm wide×70 mm long, for example). In the illustrated seventh embodiment, the adhesive spots 33 and 36 are arranged into a line. Alternatively, the adhesive spots 33 and 36 may be staggered.

The present invention is not limited to the aforementioned embodiments, and variations and modifications may be made without departing from the scope of the present invention.

What is claimed is:

1. A multi-chip type image sensor comprising:
   a base;
   a plurality of sensor chips arranged on said base so as to be staggered so that adjacent sensor chips among said sensor chips partially overlap with each other in the direction perpendicular to a direction in which said sensor chips are arranged, said sensor chips being fastened to said base by an adhesive for use in die bonding, each of said sensor chips having a plurality of light receiving elements arranged into a line at a predetermined pixel pitch Pd, each of said sensor chip comprising silicon; and
   terminal pins supported on said base and electrically coupled to said sensor chips,
   the following formula being satisfied:

$$Pc = Pd \times [1 + (Tc - Ta)(\alpha_B - \alpha_{Si})]$$

where Tc [°C.] is a curing temperature of said adhesive, Ta [°C.] is an enviroment temperature at which said image sensor is to be used, $\alpha_{Si}$ is a thermal expansion coefficient of each of said sensor chips comprising silicon, $\alpha_B$ is a thermal expansion coefficient of said base, and Pc is a pixel pitch at which said light receiving elements are arranged in each of said sensor chips before said adhesive is cured by die bonding.

2. A multi-chip type image sensor as claimed in claim 1, wherein said base comprises alumina.

3. A multi-chip type image sensor as claimed in claim 1, wherein said adhesive is electrically conductive.

4. A multi-chip type image sensor as claimed in claim 1, further comprising a cover glass which is mounted on said base so as to cover said sensor chips.

* * * * *